United States Patent
Takenouchi

(10) Patent No.: US 10,424,511 B2
(45) Date of Patent: *Sep. 24, 2019

(54) METHOD OF PROCESSING WORKPIECE

(71) Applicant: DISCO CORPORATION, Tokyo (JP)

(72) Inventor: Kenji Takenouchi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/938,755

(22) Filed: Mar. 28, 2018

(65) Prior Publication Data

US 2018/0286755 A1 Oct. 4, 2018

(30) Foreign Application Priority Data

Apr. 4, 2017 (JP) ................. 2017-074465

(51) Int. Cl.
*H01L 21/78* (2006.01)
*B23K 26/38* (2014.01)
(Continued)

(52) U.S. Cl.
CPC ............ *H01L 21/78* (2013.01); *B23K 26/364* (2015.10); *B23K 26/38* (2013.01); *B23K 26/40* (2013.01); *B26D 3/065* (2013.01); *B23K 2103/56* (2018.08); *H01L 22/32* (2013.01); *H01L 22/34* (2013.01)

(58) Field of Classification Search
None
See application file for complete search history.

(56) References Cited

U.S. PATENT DOCUMENTS 6,280,298 B1 8/2001 Gonzales
6,310,017 B1 10/2001 Grant et al.
(Continued)

FOREIGN PATENT DOCUMENTS

JP 06349926 A 12/1994
JP 09055573 A 2/1997
JP 2005021940 A 1/2005

OTHER PUBLICATIONS

Takenouchi, Kenji, U.S. Appl. No. 15/934,491, filed Mar. 23, 2018.
(Continued)

*Primary Examiner* — Asok K Sarkar
(74) *Attorney, Agent, or Firm* — Greer Burns & Crain, Ltd.

(57) ABSTRACT

A method of processing a plate-shaped workpiece that includes on a face side thereof layered bodies containing metal which are formed in superposed relation to projected dicing lines includes the steps of holding a face side of the workpiece on a holding table, thereafter, applying a laser beam having a wavelength that is absorbable by the workpiece to a reverse side thereof along the projected dicing lines to form laser-processed grooves in the workpiece which terminate short of the layered bodies, and thereafter, cutting bottoms of the laser-processed grooves with a cutting blade to sever the workpiece together with the layered bodies along the projected dicing lines. The step of cutting bottoms of the laser-processed grooves includes the step of cutting bottoms of the laser-processed grooves while supplying a cutting fluid containing an organic acid and an oxidizing agent to the workpiece.

4 Claims, 7 Drawing Sheets

(51) Int. Cl.
  *B26D 3/06* (2006.01)
  *B23K 26/40* (2014.01)
  *B23K 26/364* (2014.01)
  *H01L 21/66* (2006.01)
  *B23K 103/00* (2006.01)

(56) References Cited

U.S. PATENT DOCUMENTS

| | | |
|---|---|---|
| 6,461,940 B1 | 10/2002 | Hasegawa et al. |
| 6,791,197 B1 | 9/2004 | Katz |
| 9,130,057 B1 | 9/2015 | Kumar et al. |
| 9,349,647 B2 | 5/2016 | Takenouchi |
| 2003/0124771 A1 | 7/2003 | Maiz |
| 2004/0209443 A1 | 10/2004 | Cadieux et al. |
| 2004/0212047 A1 | 10/2004 | Joshi et al. |
| 2006/0223234 A1* | 10/2006 | Terayama ............ H01L 21/6836 438/113 |
| 2008/0191318 A1 | 8/2008 | Su et al. |
| 2008/0277806 A1 | 11/2008 | Chen et al. |
| 2011/0048200 A1 | 3/2011 | Ide et al. |
| 2012/0286415 A1* | 11/2012 | Sakai ....................... H01L 24/97 257/734 |
| 2013/0203237 A1 | 8/2013 | Yamaguchi et al. |
| 2013/0234193 A1 | 9/2013 | Odnoblyudov et al. |
| 2014/0017882 A1 | 1/2014 | Lei et al. |
| 2014/0154871 A1 | 6/2014 | Hwang et al. |
| 2015/0262881 A1* | 9/2015 | Takenouchi ............ H01L 21/78 438/460 |
| 2017/0213757 A1 | 7/2017 | Nakamura et al. |
| 2018/0166328 A1* | 6/2018 | Tang ....................... H01L 23/48 |

OTHER PUBLICATIONS

Takenouchi, Kenji, U.S. Appl. No. 15/934,443, filed Mar. 23, 2018.
Takenouchi, Kenji, U.S. Appl. No. 15/936,622, filed Mar. 27, 2018.
Takenouchi, Kenji, U.S. Appl. No. 15/937,441, filed Mar. 27, 2018.
Takenouchi, Kenji, U.S. Appl. No. 15/937,402, filed Mar. 27, 2018.
Takenouchi, Kenji, U.S. Appl. No. 15/938,832, filed Mar. 28, 2018.
Takenouchi, Kenji, U.S. Appl. No. 15/940,468, filed Mar. 29, 2018.
Takenouchi, Kenji, U.S. Appl. No. 15/940,411, filed Mar. 29, 2018.
Takenouchi, Kenji, U.S. Appl. No. 15/941,131, filed Mar. 30, 2018.
Takenouchi, Kenji, U.S. Appl. No. 15/942,682, filed Apr. 2, 2018.

* cited by examiner

METHOD OF PROCESSING WORKPIECE

BACKGROUND OF THE INVENTION

Field of the Invention

The present invention relates to a method of processing a plate-shaped workpiece that includes layered bodies containing metal which are formed in superposed relation to projected dicing lines.

Description of the Related Art

Electronic equipment, typically mobile phones and personal computers, incorporates, as indispensable components, device chips that have devices such as electronic circuits, etc. thereon. A device chip is manufactured by demarcating the face side of a wafer made of a semiconductor material such as silicon or the like into a plurality of areas with a plurality of projected dicing lines also known as streets, forming devices in the respective areas, and then dividing the wafer into device chips corresponding to the devices along the projected dicing lines.

In recent years, evaluation elements referred to as TEG (Test Element Group) for evaluating electric properties of devices are often formed on projected dicing lines on wafers as described above (see, for example, Japanese Patent Laid-open No. Hei 6-349926 and Japanese Patent Laid-open No. 2005-21940). The TEG on the projected dicing lines on a wafer makes it possible to maximize the number of device chips that can be fabricated from the wafer. Once the TEG has carried out evaluations and has been made redundant, it can be removed at the same time that the wafer is severed into device chips.

SUMMARY OF THE INVENTION

When layered bodies containing metal such as TEG are cut and removed by a cutting blade which is made of a binder with abrasive grains dispersed therein, the metal contained in the layered bodies is elongated, tending to give rise to protrusions called "burrs" due to contact with the cutting blade. If the cutting blade processes the wafer at an increased rate, then it generates more heat that is liable to produce larger burrs. Therefore, according to the processing method using the cutting blade, it is necessary to reduce the processing rate so as not to lower the quality of the processing of the wafer.

It is therefore an object of the present invention to provide a method of processing a plate-shaped workpiece that includes layered bodies containing metal which are formed in superposed relation to projected dicing lines, at an increased rate while keeping the quality of the processing of the workpiece.

In accordance with an aspect of the present invention, there is provided a method of processing a plate-shaped workpiece that includes on a face side thereof layered bodies containing metal which are formed in superposed relation to projected dicing lines, including the steps of holding the face side of the workpiece on a holding table, thereafter, applying a laser beam having a wavelength that is absorbable by the workpiece to a reverse side thereof along the projected dicing lines to form laser-processed grooves in the workpiece which terminate short of the layered bodies, and thereafter, cutting bottoms of the laser-processed grooves with a cutting blade to sever the workpiece together with the layered bodies along the projected dicing lines, in which the step of cutting bottoms of the laser-processed grooves includes the step of cutting bottoms of the laser-processed grooves while supplying a cutting fluid containing an organic acid and an oxidizing agent to the workpiece.

In the above aspect of the present invention, the method may further include the step of, before the step of cutting bottoms of the laser-processed grooves, providing a protective member on the face side of the workpiece, in which the step of cutting bottoms of the laser-processed grooves may be performed while the face side of the workpiece is held through the protective member provided thereon.

In the above aspect of the present invention, the cutting blade used in the step of cutting bottoms of the laser-processed grooves should preferably have a thickness smaller than the width of the laser-processed grooves.

In the above aspect of the present invention, the method may further include the step of, after the step of applying a laser beam and before the step of cutting bottoms of the laser-processed grooves, providing a protective member on the reverse side of the workpiece, in which the step of cutting bottoms of the laser-processed grooves may be performed while the reverse side of the workpiece is held through the protective member provided thereon.

According to the method in accordance with the aspect of the present invention, the cutting fluid which contains an organic acid and an oxidizing agent is supplied to the workpiece in severing the layered bodies containing metal with the cutting blade. The organic acid and the oxidizing agent are effective to modify the metal contained in the layered bodies, thereby lowering the ductility of the metal while the cutting blade is severing the layered bodies. The metal is thus prevented from forming burrs even when the workpiece is processed at an increased rate. In other words, the rate at which the workpiece is processed can be increased while keeping the quality of the processing of the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A method of processing a workpiece according to an embodiment of the present invention will be described below with reference to the accompanying drawings. The method of processing a workpiece according to the present embodiment, also referred to as "workpiece processing method," is a method of processing a plate-shaped workpiece that includes on a face side thereof layered bodies containing metal which are formed in superposed relation to projected dicing lines, and includes a first sheet sticking step (first protective member providing step) (see FIG. 2A), a first holding step (see FIG. 2B), a laser processing step (see FIG. 3), a second sheet sticking step (second protective member providing step) (see FIG. 4A), a second holding step (see FIG. 4B), and a cutting step (see FIG. 5).

In the first sheet sticking step, a sheet (protective member) is stuck to (provided on) a face side of a workpiece having layered bodies disposed on the face side thereof. In the first holding step, the face side of the workpiece is held on a chuck table (first holding table) of a laser processing apparatus. In the laser processing step, a laser beam having a wavelength that is to be absorbed by the workpiece, i.e., a wavelength that is absorbable by the workpiece, is applied to a reverse side of the workpiece to form laser-processed grooves in the workpiece along the projected dicing lines to a depth that terminates short of, i.e., does not reach, the layered bodies. In the second sheet sticking step, a sheet (protective member) is stuck to (provided on) the reverse side of the workpiece. In the second holding step, the reverse side of the workpiece is held on a chuck table (second holding table) of a cutting apparatus. In the cutting step, the bottoms of the laser-processed grooves are cut by a cutting blade while a cutting fluid containing an organic acid and an oxidizing agent is being supplied to the workpiece and the cutting blade, severing the workpiece and the layered bodies along the projected dicing lines. The workpiece processing method according to the present embodiment will be described below.

Figure 1A:
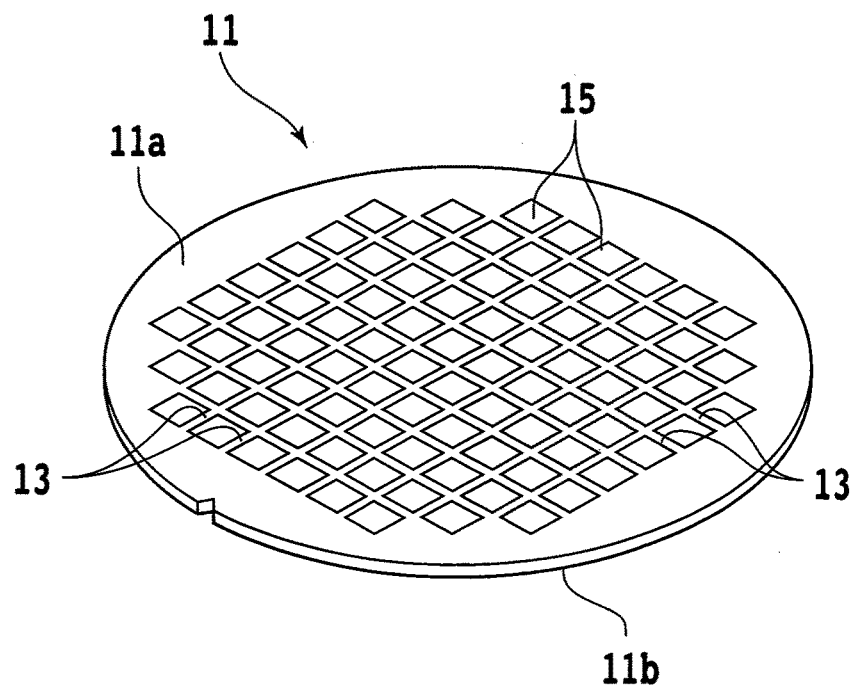
FIG. 1A is a perspective view schematically showing a workpiece by way of example.
Figure 1B:
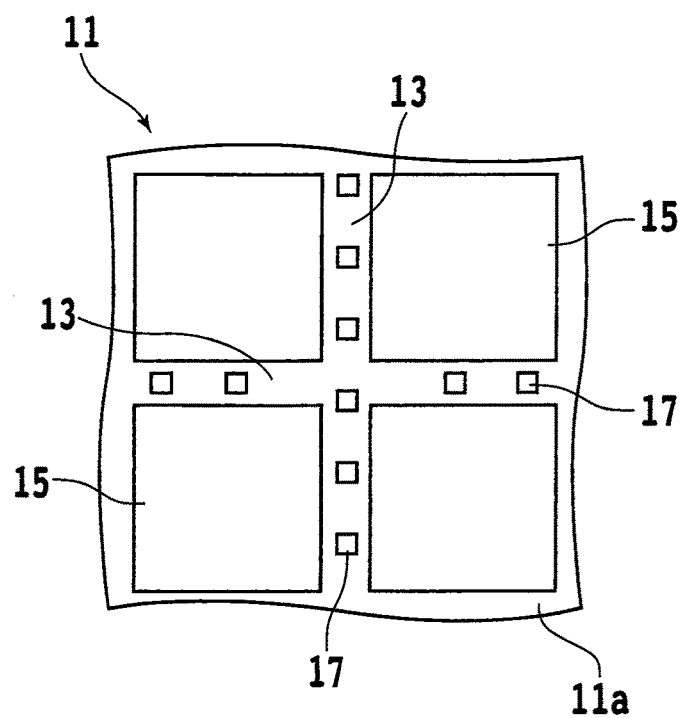
FIG. 1B is an enlarged fragmentary plan view of a face side of the workpiece.

FIG. 1A is a perspective view schematically showing a workpiece 11 by way of example, which is to be processed by the workpiece processing method according to the present embodiment, and FIG. 1B is an enlarged fragmentary plan view of a face side 11a of the workpiece 11. As shown in FIG. 1A, the workpiece 11 includes a disk-shaped wafer made of a semiconductor material such as silicon (Si) or the like, and the face side 11a thereof is divided into a central device area and an outer peripheral marginal area surrounding the central device area.

The central device area is further demarcated into a plurality of areas by a grid of projected dicing lines or streets 13, with devices 15 such as an ICs (Integrated Circuits) or the like being formed in the respective areas. As shown in FIG. 1B, a plurality of layered bodies 17 containing metal are disposed on the projected dicing lines 13. The layered bodies 17 are provided as evaluation elements referred to as TEG (Test Element Group), for example.

According to the present embodiment, the workpiece 11 is illustrated as including a disk-shaped wafer made of a semiconductor such as silicon or the like. However, the workpiece 11 is not limited to particular materials, shapes, structures, sizes, etc. Similarly, the devices 15 and the layered bodies 17 are not limited to particular kinds, quantities, shapes, structures, sizes, layouts, etc. For example, a packaged substrate where layered bodies 17 functioning as electrodes are formed along projected dicing lines 13 may be used as the workpiece 11.

Figure 2A:
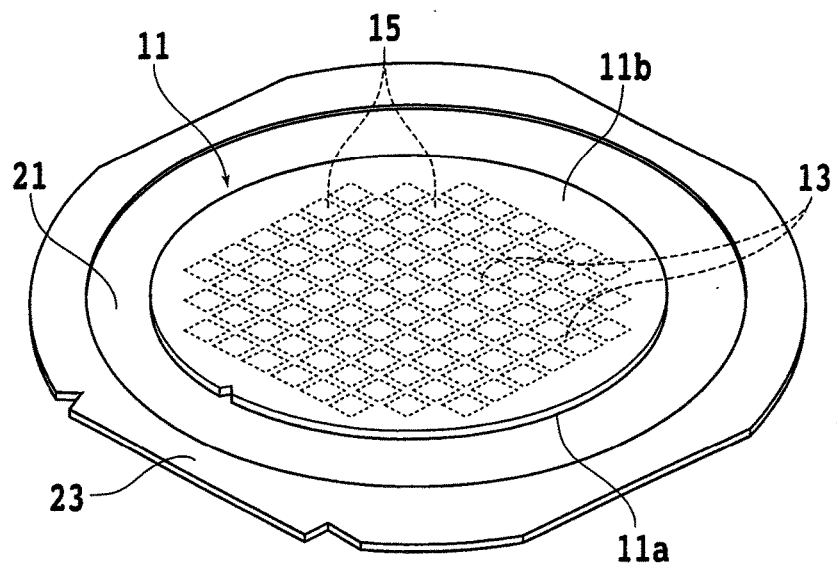
FIG. 2A is a perspective view illustrative of a first sheet sticking step of a workpiece processing method according to an embodiment of the present invention.

In the workpiece processing apparatus according to the present embodiment, the first sheet sticking step (first protective member providing step) is carried out to stick (provide) a sheet (protective member) to (on) the face side 11a of the workpiece 11. FIG. 2A is a perspective view illustrative of the first sheet sticking step. In the first sheet sticking step, as shown in FIG. 2A, a sheet (protective member) 21 made of resin, which is larger in diameter than the workpiece 11, is stuck to the face side 11a of the workpiece 11. An annular frame 23 is fixed to an outer peripheral portion of the sheet 21.

The workpiece 11 is thus supported on the annular frame 23 by the sheet 21. Though an example in which the workpiece 11 supported on the annular frame 23 by the sheet 21 is processed will be described below in the present embodiment, the workpiece 11 may be processed without the sheet 21 and the frame 23 being used. In this case, the first sheet sticking step is dispensed with. Instead of the sheet 21 of resin, a wafer equivalent to the workpiece 11 or another substrate may be stuck as a protective member to the workpiece 11.

Figure 2B:
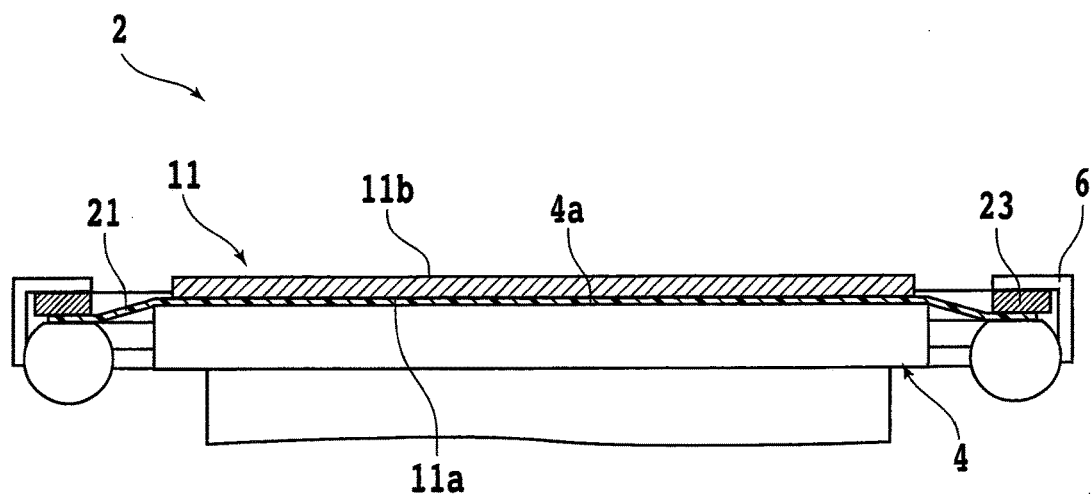
FIG. 2B is a side elevational view, partly in cross section, illustrative of a first holding step of the workpiece processing method.

The first sheet sticking step is followed by the first holding step to hold the workpiece 11 on a chuck table (first holding table) of the laser processing apparatus. FIG. 2B is a side elevational view, partly in cross section, illustrative of the first holding step. The first holding step is performed using a laser processing apparatus 2 shown in FIG. 2B, for example. The laser processing apparatus 2 includes a chuck table (first holding table) 4 for holding the workpiece 11 under suction thereon.

The chuck table 4 is coupled to a rotary actuator, not shown, such as a motor or the like, for rotation about an axis substantially parallel to a vertical direction. The chuck table 4 is disposed above a moving mechanism, not shown, that moves the chuck table 4 in a processing-feed direction (first horizontal direction) and an indexing-feed direction (second horizontal direction).

The chuck table 4 has an upper surface, part of which serves as a holding surface 4a for holding the workpiece 11, i.e., the sheet 21, under suction thereon. The holding surface 4a is connected to a suction source, not shown, through a suction channel, not shown, that is defined in the chuck table 4. When a negative pressure from the suction source is caused to act on the holding surface 4a, the workpiece 11 is held under suction on the chuck table 4. A plurality of clamps 6 for securing the annular frame 23 are provided on an outer peripheral region of the chuck table 4.

In the first holding step, the sheet 21 that sticks to the face side 11a of the workpiece 11 is held in contact with the holding surface 4a of the chuck table 4, and a negative pressure from the suction source is caused to act on the sheet 21. At the same time, the frame 23 is secured by the clamps 6. The workpiece 11 is thus held by the chuck table 4 and the clamps 6 with the reverse side 11b being exposed upwardly.

Figure 3:
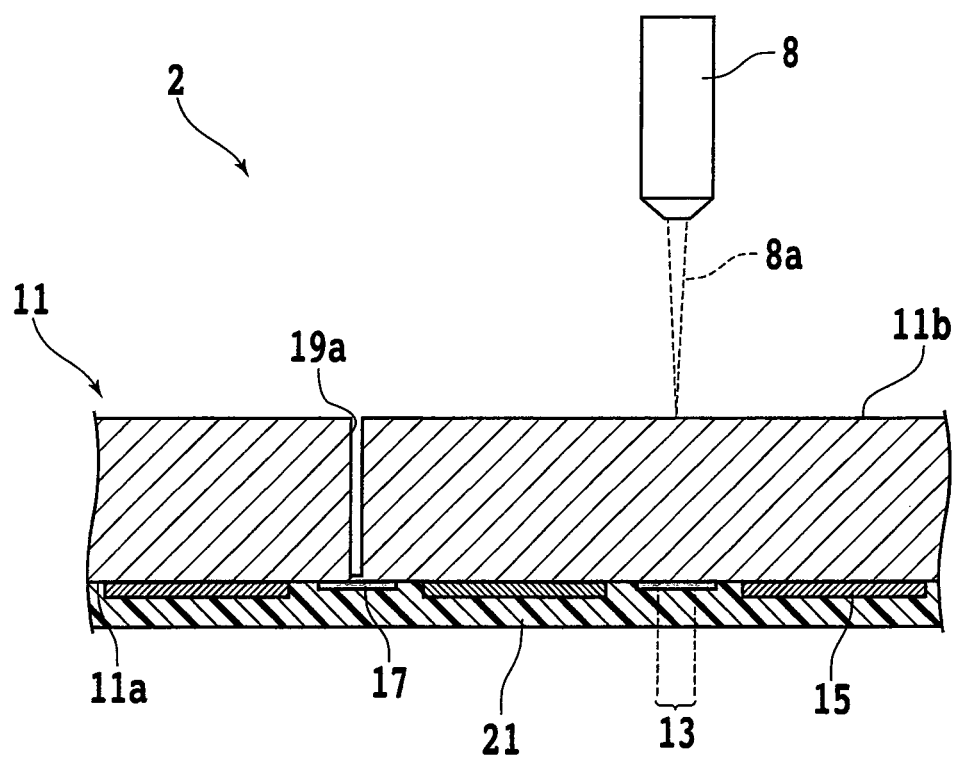
FIG. 3 is a fragmentary side elevational view, partly in cross section, illustrative of a laser processing step of the workpiece processing method.

After the first holding step, the laser processing step is carried out to apply a laser beam to the workpiece 11 from the reverse side 11b thereof to form laser-processing grooves in the workpiece 11 along the projected dicing lines 13 to a depth that terminates short of, i.e., does not reach, the layered bodies 17. The laser processing step is performed also using the laser processing apparatus 2. FIG. 3 is a fragmentary side elevational view, partly in cross section, illustrative of the laser processing step. As shown in FIG. 3, the laser processing apparatus 2 further includes a laser irradiation unit 8 disposed above the chuck table 4.

The laser irradiation unit 8 applies a pulsed laser beam 8a generated and emitted by a laser oscillator, not shown, and focuses the pulsed laser beam 8a at predetermined positions in the workpiece 11. The laser oscillator is arranged to generate and emit the pulsed laser beam 8a having a wavelength that is to be absorbed by the workpiece 11, for example, i.e., a wavelength that is absorbable by the workpiece 11 or a wavelength that can easily be absorbed by the workpiece 11.

In the laser processing step, the chuck table 4 is turned about its own axis to bring a target projected dicing line 13 into alignment with the processing-feed direction of the laser processing apparatus 2. Furthermore, the chuck table 4 is moved to position the laser irradiation unit 8 into alignment with an extension of the target projected dicing line 13. The position of the target projecting dicing line 13 can be confirmed from the reverse side 11b by using a camera that is sensitive in an infrared radiation range, for example.

Then, as shown in FIG. 3, while the pulsed laser beam 8a is being applied from the laser irradiation unit 8 to the exposed reverse side 11b of the workpiece 11, the chuck table 4 is moved in the processing-fed direction. The pulsed laser beam 8a is focused on the reverse side 11b of the workpiece 11 or within the workpiece 11, for example. Energy parameters of the pulsed laser beam 8a, i.e., the power level, repetitive frequency, etc. of the pulsed laser beam 8a, are adjusted in such a range that the pulsed laser beam 8a does not sever the workpiece 11.

In this manner, the pulsed laser beam 8a is applied to the workpiece 11 along the target projected dicing line 13 to form a laser-processed groove 19a in the workpiece 11 along the target projected dicing line 13 to a depth which terminates short of, i.e., does not reach, the layered body 17. The above process is repeated to form laser-processed grooves 19a in the workpiece 11 along all the projected dicing lines 13, whereupon the laser processing step is finished.

Figure 4A:
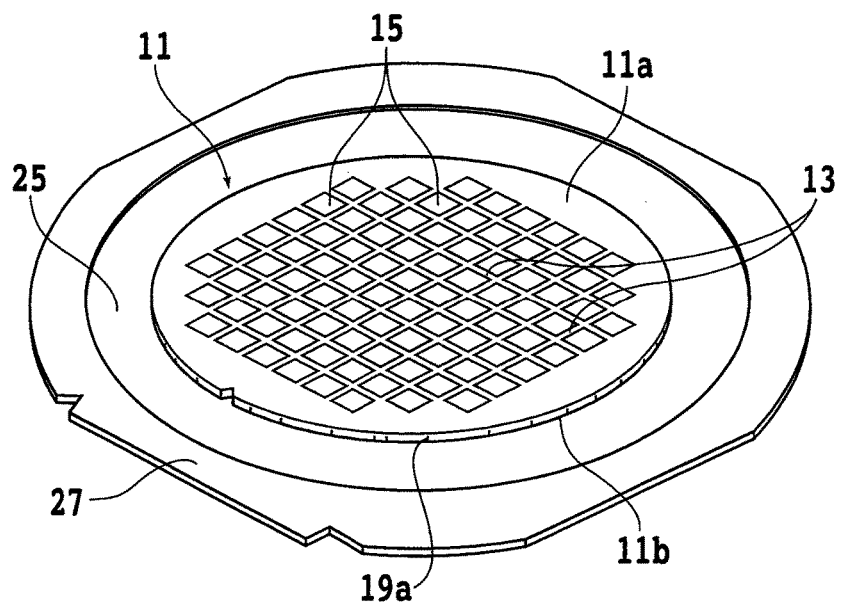
FIG. 4A is a perspective view illustrative of a second sheet sticking step of the workpiece processing method.

The laser processing step is followed by the second sheet sticking step (second protective member providing step) to stick (provide) a sheet (protective member) to (on) the reverse side 11b of the workpiece 11. FIG. 4A is a perspective view illustrative of the second sheet sticking step. In the second sheet sticking step, as shown in FIG. 4A, a sheet (protective member) 25 made of resin, which is larger in diameter than the workpiece 11, is stuck to the reverse side 11b of the workpiece 11. An annular frame 27 is fixed to an outer peripheral portion of the sheet 25.

The workpiece 11 is thus supported on the annular frame 27 by the sheet 25. Though an example in which the workpiece 11 supported on the annular frame 27 by the sheet 25 is processed will be described below in the present embodiment, the workpiece 11 may be processed without the sheet 25 and the frame 27 being used. In this case, the second sheet sticking step is dispensed with. Instead of the sheet 25 of resin, a wafer equivalent to the workpiece 11 or another substrate may be stuck as a protective member to the workpiece 11.

Figure 4B:
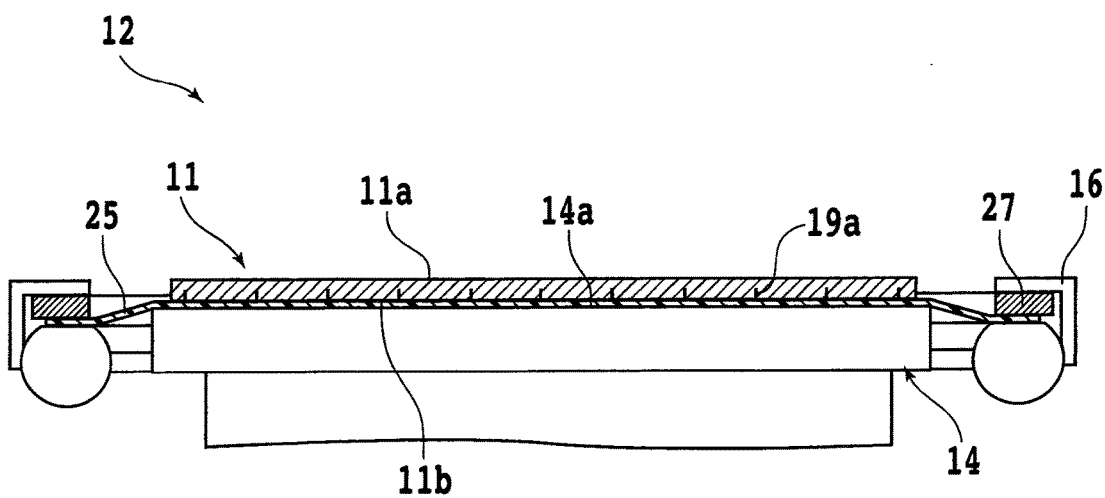
FIG. 4B is a side elevational view, partly in cross section, illustrative of a second holding step of the workpiece processing method.

The second sheet sticking step is followed by the second holding step to hold the workpiece 11 on a chuck table (second holding table) of a cutting apparatus. FIG. 4B is a side elevational view, partly in cross section, illustrative of the second holding step. Prior to the second holding step, the sheet 21 on the face side 11a and the frame 23 are removed. The second holding step is performed using a cutting apparatus 12 shown in FIG. 4B, for example. The cutting apparatus 12 includes a chuck table (second holding table) 14 for holding the workpiece 11 under suction thereon.

The chuck table 14 is coupled to a rotary actuator, not shown, such as a motor or the like, for rotation about an axis substantially parallel to a vertical direction. The chuck table 14 is disposed above a processing-feed mechanism, not shown, that moves the chuck table 14 in a processing-feed direction (first horizontal direction).

The chuck table 14 has an upper surface, part of which serves as a holding surface 14a for holding the workpiece 11, i.e., the sheet 25, under suction thereon. The holding surface 14a is connected to a suction source, not shown, through a suction channel, not shown, that is defined in the chuck table 14. When a negative pressure from the suction source is caused to act on the holding surface 14a, the workpiece 11 is held under suction on the chuck table 14. A plurality of clamps 16 for securing the annular frame 27 are provided on an outer peripheral region of the chuck table 14.

In the second holding step, the sheet 25 that sticks to the reverse side 11b of the workpiece 11 is held in contact with the holding surface 14a of the chuck table 14, and a negative pressure from the suction source is caused to act on the sheet 25. At the same time, the frame 27 is secured by the clamps 16. The workpiece 11 is thus held by the chuck table 14 and the clamps 16 with the layered bodies 17 on the face side 11a being exposed upwardly.

Figure 5:
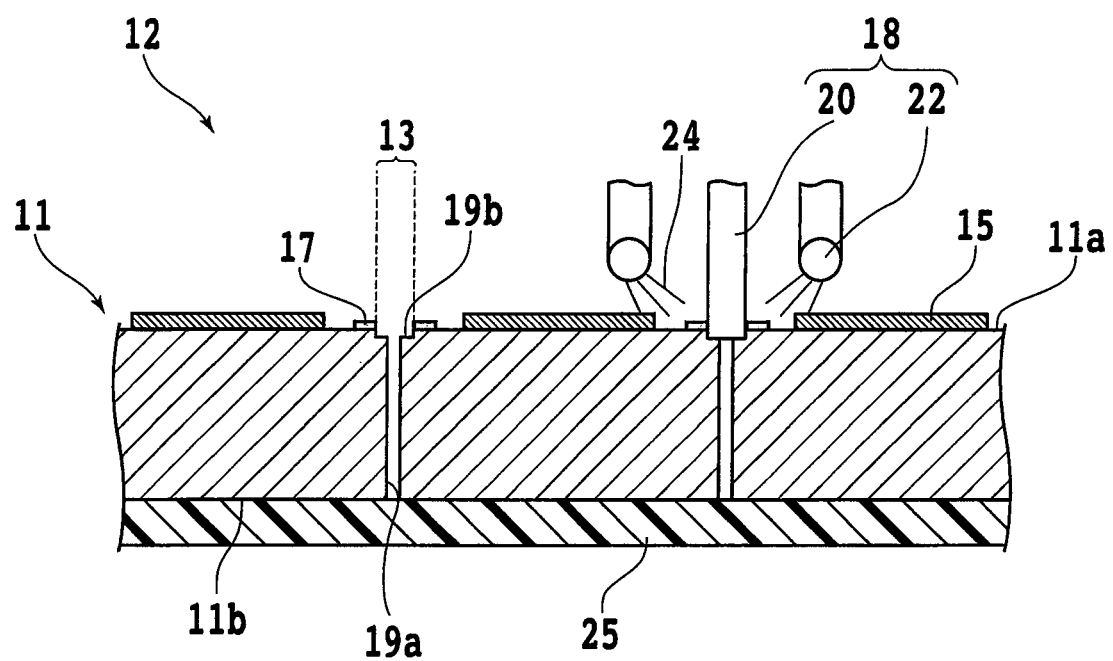
FIG. 5 is a fragmentary side elevational view, partly in cross section, illustrative of a cutting step of the workpiece processing method.

After the second holding step, the cutting step is carried out to cut the bottoms of the laser-processed grooves 19a to sever the workpiece 11 and the layered bodies 17 along the projected dicing lines 13. FIG. 5 is a fragmentary side elevational view, partly in cross section, illustrative of the cutting step. The cutting step is performed also using the cutting apparatus 12. As shown in FIG. 5, the cutting apparatus 12 further includes a cutting unit 18 disposed above the chuck table 14.

The cutting unit 18 includes a spindle, not shown, that serves as a rotational shaft substantially perpendicular to the processing-feed direction. An annular cutting blade 20 made of a binder with abrasive grains dispersed therein is mounted on one end of the spindle. The other end of the spindle is coupled to a rotary actuator, not shown, such as a motor or the like. The cutting blade 20 on the one end of the spindle is rotatable about its own axis by forces transmitted from the rotary actuator.

The spindle is supported by a moving mechanism, not shown, which moves the cutting blade 20 in an indexing-feed direction (second horizontal direction) perpendicular to the processing-feed direction and a vertical direction. A pair of nozzles 22 are disposed on both sides of the cutting blade 20, which is thus disposed between the nozzles 22. The nozzles 22 are arranged to supply a cutting fluid 24 to the cutting blade 20 and the workpiece 11.

In the cutting step, the chuck table 14 is turned about its own axis to bring a target laser-processed groove 19a (projected dicing line 13) into alignment with the processing-feed direction of the cutting apparatus 2. The chuck table 14 and the cutting unit 18 are moved relatively to each other to position the plane of the cutting blade 20 into alignment with an extension of the target laser-processed groove 19a.

Then, the lower end of the cutting blade 20 is moved to a position lower than the lower surface of the layered body 17.

Thereafter, while the cutting blade 20 is rotated about its own axis, the chuck table 14 is moved in the processing-feed direction. At the same time, the nozzles 22 supply the cutting fluid 24 which contains an organic acid and an oxidizing agent to the cutting blade 20 and the workpiece 11. The cutting blade 20 moves along the target laser-processed groove 19a and cuts into the layered body 17 and the workpiece 11, cutting the bottom of the target laser-processed groove 19a and fully severing the workpiece 11 and the layered body 17 thereby to form a kerf (slit) 19b thicknesswise in the workpiece 11 and the layered body 17 along the target laser-processed groove 19a.

The organic acid contained in the cutting fluid 24 modifies the metal in the layered body 17 to restrain its ductility. The oxidizing agent contained in the cutting fluid 24 makes it easier for the metal in the layered bodies 17 to be oxidized on its surface. As a result, the ductility of the metal in the layered body 17 is sufficiently lowered for increased processability of the workpiece 11.

As the organic acid included in the cutting fluid 24, there can be used, for example, a compound that has at least one carboxyl group and at least one amino group in its molecule. In this case, it is preferable that at least one of amino group(s) is a secondary or tertiary amino group. In addition, compound used as the organic acid may have a substituent group.

As the organic acid, there can be used amino acids. Examples of the amino acids usable here include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, antipain, etc. Among others, particularly preferred are glycine, L-alanine, L-proline, L-histidine, L-lysine, and dihydroxyethylglycine.

Also, amino polyacids can be used as the organic acid. Examples of the amino polyacids usable here include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, N—N'-bis(2-hydroxybenzyl)ethylenediamine-N,N'-diacetic acid, etc.

Further, carboxylic acids can be used as the organic acid. Examples of the carboxylic acids usable here include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, etc., unsaturated carboxylic acids such as acrylic acid, methacrylic acid, crotonic acid, fumaric acid, maleic acid, mesaconic acid, citraconic acid, aconitic acid, etc., and cyclic unsaturated carboxylic acids such as benzoic acids, toluic acid, phthalic acids, naphthoic acids, pyromellitic acid, naphthalic acid, etc.

As the oxidizing agent included in the cutting fluid 24, there can be used, for example, hydrogen peroxide, peroxides, nitrates, iodates, periodates, hypochlorites, chlorites, chlorates, perchlorates, persulfates, dichromates, permanganates, cerates, vanadates, ozonated water, silver(II) salts, iron(III) salts, and their organic complex salts.

Besides, an anticorrosive may be mixed in the cutting fluid 24. Mixing of the anticorrosive makes it possible to prevent corrosion (elution) of the metal included in the workpiece 11. As the anticorrosive, there is preferably used a heterocyclic aromatic ring compound which has at least three nitrogen atoms in its molecule and has a fused ring structure or a heterocyclic aromatic ring compound which has at least four nitrogen atoms in its molecule. Further, the aromatic ring compound preferably includes a carboxyl group, sulfo group, hydroxyl group, or alkoxyl group. Specific preferable examples of the aromatic ring compound include tetrazole derivatives, 1,2,3-triazole derivatives, and 1,2,4-triazole derivatives.

Examples of the tetrazole derivatives usable as the anticorrosive include those which do not have a substituent group on the nitrogen atoms forming the tetrazole ring and which have, introduced into the 5-position of the tetrazole, a substituent group selected from the group consisting of sulfo group, amino group, carbamoyl group, carbonamide group, sulfamoyl group, and sulfonamide group, or an alkyl group substituted with at least one substituent group selected from the group consisting of hydroxyl group, carboxyl group, sulfo group, amino group, carbamoyl group, carbonamide group, sulfamoyl group, and sulfonamide group.

Examples of the 1,2,3-triazole derivatives usable as the anticorrosive include those which do not have a substituent group on the nitrogen atoms forming the 1,2,3-triazole ring and which have, introduced into the 4-position and/or 5-position of the 1,2,3-triazole, a substituent group selected from the group consisting of hydroxyl group, carboxyl group, sulfo group, amino group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

Besides, examples of the 1,2,4-triazole derivatives usable as the anticorrosive include those which do not have a substituent group on the nitrogen atoms forming the 1,2,4-triazole ring and which have, introduced into the 2-position and/or 5-position of 1,2,4-triazole, a substituent group selected from the group consisting of sulfo group, carbamoyl group, carbonamide group, sulfamoyl group, and sulfonamide group, or an alkyl or aryl group substituted with at least one substituent group selected from the group consisting of hydroxyl group, carboxyl group, sulfo group, amino group, carbamoyl group, carbonamide group, sulfamoyl group, and sulfonamide group.

The above process is repeated to cut the workpiece 11 along all the projected dicing lines 13, whereupon the cutting step is finished.

In the workpiece processing method according to the present embodiment, as described above, the cutting fluid 24 which contains an organic acid and an oxidizing agent is supplied to the workpiece 11 in severing the layered bodies 17. The organic acid and the oxidizing agent are effective to modify the metal contained in the layered bodies 17, thereby lowering the ductility of the metal while the cutting blade 20 is severing the layered bodies 17. The metal is thus prevented from forming burrs even when the workpiece 11 is processed at an increased rate. In other words, the rate at which the workpiece 11 is processed can be increased while keeping the quality of the processing of the workpiece 11.

The present invention is not limited to the above embodiment, but various changes and modifications may be made therein. For example, the width of the laser-processed grooves formed in the laser processing step may be larger than the thickness of the cutting blade used in the cutting step. In other words, the thickness of the cutting blade used in the cutting step may be smaller than the width of the laser-processed grooves formed in the laser processing step.

Figure 6A:
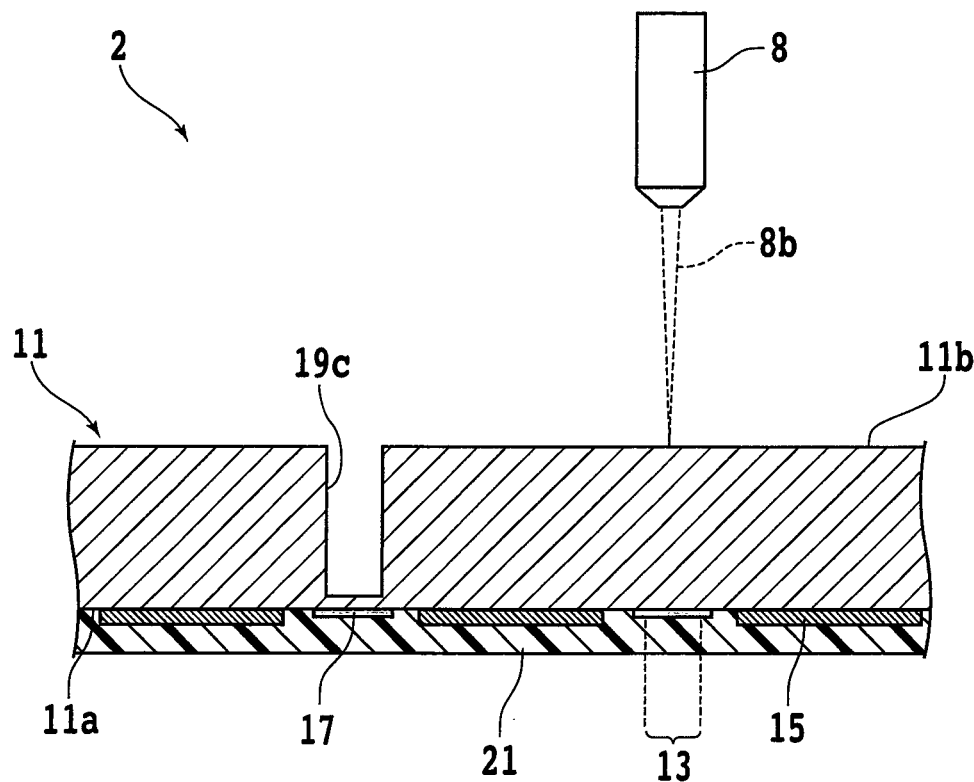
FIG. 6A is a fragmentary side elevational view, partly in cross section, illustrative of a laser processing step according to a modification.
Figure 6B:
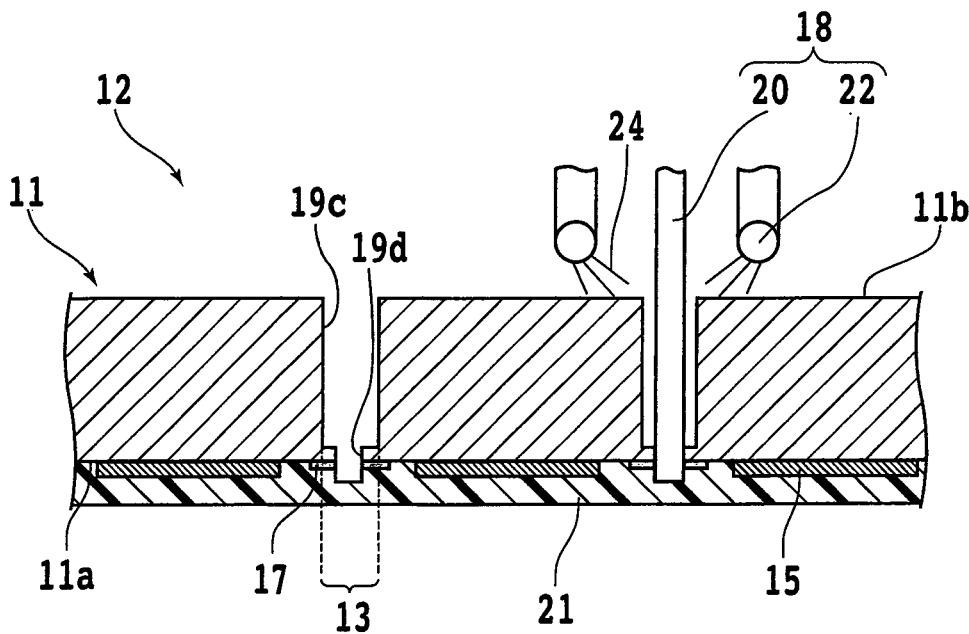
FIG. 6B is a fragmentary side elevational view, partly in cross section, illustrative of a cutting step according to the modification.

FIG. 6A is a fragmentary side elevational view, partly in cross section, illustrative of a laser processing step according to a modification, and FIG. 6B is a fragmentary side elevational view, partly in cross section, illustrative of a cutting step according to the modification. As shown in FIG. 6A, the laser processing step according to the modification is performed using the same laser processing apparatus 2 as in the above embodiment.

In the laser processing step according to the modification, the chuck table 4 is turned about its own axis to bring a target projected dicing line 13 into alignment with the processing-feed direction of the laser processing apparatus 2. Furthermore, the chuck table 4 is moved to position the laser irradiation unit 8 into alignment with an extension of the target projected dicing line 13.

Then, as shown in FIG. 6A, while a pulsed laser beam 8b is being applied from the laser irradiation unit 8 to the exposed reverse side 11b of the workpiece 11, the chuck table 4 is moved in the processing-fed direction. The pulsed laser beam 8b is focused on the reverse side 11b of the workpiece 11 or within the workpiece 11, for example. Energy parameters of the pulsed laser beam 8b, i.e., the power level, repetitive frequency, etc. of the pulsed laser beam 8b, are adjusted in such a range that the pulsed laser beam 8b does not sever the workpiece 11.

In this manner, the pulsed laser beam 8b is applied to the workpiece 11 along the target projected dicing line 13 to form a laser-processed groove 19c in the workpiece 11 along the target projected dicing line 13 to a depth which terminates short of, i.e., does not reach, the layered body 17. In the laser processing step, conditions in which the pulsed laser beam 8b is applied may be adjusted in order to form a laser-processed groove 19c having a width larger than the thickness of a cutting blade to be used in the subsequent cutting step. The above process is repeated to form laser-processed grooves 19c in the workpiece 11 along all the projected dicing lines 13, whereupon the laser processing step according to the modification is finished.

The laser processing step is followed by a second holding step, with no second sheet sticking step being carried out. The second holding step according to the modification is performed using the same cutting apparatus 12 as in the above embodiment. In the second holding step, the sheet 21 that sticks to the face side 11a of the workpiece 11 is held in contact with the holding surface 14a of the chuck table 14, and a negative pressure from the suction source is caused to act on the sheet 21. At the same time, the frame 23 is secured by the clamps 16. The workpiece 11 is thus securely held with the reverse side 11b being exposed upwardly.

After the second holding step, the cutting step is carried out. The cutting step according to the modification is performed also using the cutting apparatus 12. However, the cutting step according to the modification uses a cutting blade 20 having a thickness smaller than the width of the laser-processed grooves 19c.

First, the chuck table 14 is turned about its own axis to bring a target laser-processed groove 19c (projected dicing line 13) into alignment with the processing-feed direction of the cutting apparatus 2. The chuck table 14 and the cutting unit 18 are moved relatively to each other to position the plane of the cutting blade 20 into alignment with an extension of the target laser-processed groove 19c. Then, the lower end of the cutting blade 20 is moved to a position lower than the lower surface of the layered body 17.

Thereafter, while the cutting blade 20 is rotated about its own axis, the chuck table 14 is moved in the processing-feed direction. At the same time, the nozzles 22 supply a cutting fluid 24 which contains an organic acid and an oxidizing agent to the cutting blade 20 and the workpiece 11. The cutting blade 20 moves in and along the target laser-processed groove 19c and cuts into the workpiece 11, cutting the bottom of the target laser-processed groove 19c and fully severing the workpiece 11 and the layered body 17 thereby to form a kerf (slit) 19d thicknesswise in the workpiece 11 and the layered body 17 along the target laser-processed groove 19c.

The organic acid contained in the cutting fluid 24 modifies the metal in the layered body 17 to restrain its ductility. The oxidizing agent contained in the cutting fluid 24 makes it easier for the metal in the layered bodies 17 to be oxidized on its surface. As a result, the ductility of the metal in the layered body 17 is sufficiently lowered for increased processability of the workpiece 11.

In the cutting step according to the modification, since the cutting blade 20 that has a thickness smaller than the width of the laser-processed grooves 19c is used, the cutting fluid 24 tends to accumulate between the side wall surfaces of the laser-processed groove 19c and the cutting blade 20. As a consequence, the layered body 17 can be supplied with a sufficient amount of cutting fluid 24 for further increased processability of the workpiece 11.

In the above modification, the second holding step and the cutting step are carried out with no second sheet sticking step being carried out. However, the second sheet sticking step may be carried out and then the second holding step and the cutting step may be carried out. In such a case, the reverse side 11b of the workpiece 11 is held on the chuck table 14, and the cutting blade 20 cuts into the face side 11a. Moreover, in the above embodiment, the second holding step and the cutting step may be carried out with no second sheet sticking step being carried out.

Figure 7:
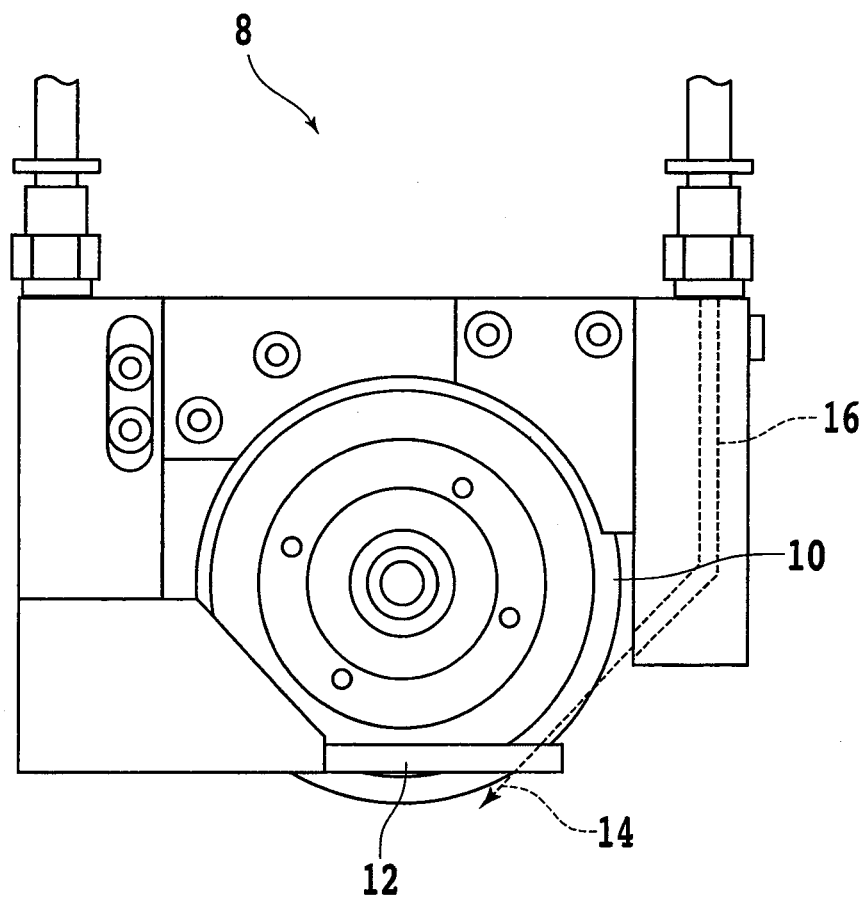
FIG. 7 is a side elevational view of a nozzle for supplying a cutting fluid according to another mode of the present invention.

In the above cutting step, the cutting fluid 24 is supplied from the nozzles 22 disposed on both sides of the cutting blade 20. However, the present invention is not limited to any particular nozzle configuration for supplying the cutting fluid 24. FIG. 7 is a side elevational view of a nozzle for supplying the cutting fluid 24 according to another mode of the present invention. As shown in FIG. 7, a cutting unit 18 according to the modification includes, in addition to the cutting blade 20 and the pair of nozzles 22, a shower nozzle 26 disposed in front of or behind the cutting blade 20.

The nozzle 26 makes it easier to supply the cutting fluid 24 to the kerf (slit) 19b or 19d for more effectively modifying the metal contained in the layered body 17. In particular, the nozzle 26 has an ejection port oriented obliquely downwardly toward a region where the cutting blade 20 processes the workpiece 11, as shown in FIG. 7, so that the kerf 19b or 19d is supplied and filled with an increased amount of cutting fluid 24 for more effectively modifying the metal contained in the layered body 17, which is preferable. Though both the nozzles 22 and the nozzle 26 are used in FIG. 7, the nozzles 22 may be dispensed with and only the nozzle 26 may be used alone.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A method of processing a plate-shaped workpiece that includes on a face side thereof layered bodies containing metal which are formed in superposed relation to projected dicing lines, comprising the steps of:
    holding the face side of said workpiece on a holding table;
    thereafter, applying a laser beam having a wavelength that is absorbable by said workpiece to a reverse side thereof along the projected dicing lines to form laser-processed grooves in said workpiece, extending along the projected dicing lines, which terminate short of said layered bodies, thereby leaving a portion of said workpiece above said layered bodies; and
    thereafter, cutting bottoms of said laser-processed grooves, including said portion of said workpiece above said layered bodies, with a cutting blade to sever said workpiece together with said layered bodies along said projected dicing lines;
    wherein said step of cutting bottoms of said laser-processed grooves includes the step of cutting bottoms of said laser-processed grooves while supplying a cutting fluid containing an organic acid and an oxidizing agent to said workpiece, wherein the organic acid modifies the metal in the layered bodies to restrain ductility of the metal.

2. The method according to claim 1, further comprising the step of:
    before said step of cutting bottoms of said laser-processed grooves, providing a protective member on the face side of said workpiece;
    wherein said step of cutting bottoms of said laser-processed grooves is performed while the face side of said workpiece is held through said protective member provided thereon.

3. The method according to claim 2, wherein the cutting blade used in said step of cutting bottoms of said laser-processed grooves has a thickness smaller than the width of said laser-processed grooves.

4. The method according to claim 1, further comprising the step of:
    after said step of applying a laser beam and before said step of cutting bottoms of said laser-processed grooves, providing a protective member on the reverse side of said workpiece;
    wherein said step of cutting bottoms of said laser-processed grooves is performed while the reverse side of said workpiece is held through said protective member provided thereon.

* * * * *